United States Patent
Wang et al.

(10) Patent No.: US 9,102,901 B2
(45) Date of Patent: Aug. 11, 2015

(54) METHODS AND COMPOSITIONS FOR REMOVAL OF METAL HARDMASKS

(71) Applicant: Rohm and Haas Electronic Materials LLC, Marlborough, MA (US)

(72) Inventors: Deyan Wang, Hudson, MA (US);
Martin W. Bayes, Hopkinton, MA (US);
Peter Trefonas, Medway, MA (US);
Kathleen M. O'connell, Cumberland, RI (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 139 days.

(21) Appl. No.: 13/786,834

(22) Filed: Mar. 6, 2013

(65) Prior Publication Data
US 2014/0179582 A1    Jun. 26, 2014

Related U.S. Application Data

(60) Provisional application No. 61/739,994, filed on Dec. 20, 2012.

(51) Int. Cl.
*C11D 3/04* (2006.01)
*C11D 11/00* (2006.01)

(52) U.S. Cl.
CPC ............ *C11D 3/046* (2013.01); *C11D 11/0047* (2013.01)

(58) Field of Classification Search
CPC .................................................. C11D 11/0047
USPC .................................... 510/175, 176; 134/1.3
See application file for complete search history.

(56) References Cited

U.S. PATENT DOCUMENTS

| 5,320,709 | A  | * | 6/1994  | Bowden et al. | 438/745 |
| 6,043,005 | A  | * | 3/2000  | Haq           | 430/331 |
| 6,350,560 | B1 | * | 2/2002  | Sahbari       | 430/325 |
| 8,062,429 | B2 | * | 11/2011 | Lee           | 134/1.3 |
| 8,389,418 | B2 | * | 3/2013  | Epton et al.  | 438/754 |
| 2004/0147420 | A1 | * | 7/2004  | Zhou et al.   | 510/176 |
| 2004/0224528 | A1 | * | 11/2004 | Mirth         | 438/759 |
| 2005/0288199 | A1 | * | 12/2005 | Oowada et al. | 510/175 |
| 2006/0003910 | A1 | * | 1/2006  | Hsu et al.    | 510/176 |
| 2006/0016785 | A1 | * | 1/2006  | Egbe et al.   | 216/83  |
| 2006/0081273 | A1 | * | 4/2006  | McDermott et al. | 134/26 |

FOREIGN PATENT DOCUMENTS

| WO | 03/091376   | A1 | 11/2003 |
| WO | 2006/054996 | A1 | 5/2006  |
| WO | 2006/110645 | A2 | 10/2006 |
| WO | 2007/120259 | A2 | 10/2007 |
| WO | 2008/080097 | A2 | 7/2008  |
| WO | 2008/098034 | A1 | 8/2008  |
| WO | 2009/073596 | A2 | 6/2009  |
| WO | 2012/009639 | A2 | 1/2012  |

* cited by examiner

*Primary Examiner* — Gregory Webb

(57) ABSTRACT

The invention provides a process for removing a film from a substrate, said process comprising applying a composition to the film, and
wherein the composition comprises at least the following:
a) water; and
b) at least one compound selected from the following compounds (i-v):
i) $NR_4HF_2$ (Formula 1),
wherein R═H, alkyl, substituted alkyl,
ii) $NR_4F$ (Formula 2),
wherein R═H, alkyl, substituted alkyl,
iii) HF (hydrofluoric acid),
iv) $H_2SiF_6$ (hexafluorosilicic acid), or
v) combinations thereof.
The invention also provides a composition comprising at least the following:
a) water; and
b) at least one compound selected from the following compounds (i-v):
i) $NR_4HF_2$ (Formula 1),
wherein R═H, alkyl, substituted alkyl,
ii) $NR_4F$ (Formula 2),
wherein R═H, alkyl, substituted alkyl,
iii) HF (hydrofluoric acid),
iv) $H_2SiF_6$ (hexafluorosilicic acid), or
v) combinations thereof.

11 Claims, No Drawings

METHODS AND COMPOSITIONS FOR REMOVAL OF METAL HARDMASKS

REFERENCE TO RELATED APPLICATIONS

The present application claims the benefit of U.S. Provisional Application No. 61/739,994, filed Dec. 20, 2012.

BACKGROUND

Formulations for Spin-On Mixed Metal Hardmask (SOMMH), based on organometal compounds, contain either polymeric organometal materials, or molecular organometal materials along with a proper polymer binder. For the latter, the polymer binder serves as a film forming agent, and upon curing, the molecular organometal compounds are linked into a cross-linked network. A curing bake can initiates cross-linking reactions by condensing an organic moiety (an alcohol in general) out of the coated film. Various amounts of organo material remains in the film after a curing bake. In the fabrication of electronic films, residuals of the SOMMH process need to be removed effectively. Compositions for the removal of films, for example, inorganic and/or polymeric films, are disclosed in the following references: WO 2012/009639, WO 2009/073596, WO 2008/098034, WO 2008/080097, WO 2007/120259, WO 2006/110645, WO 2006/054996, and WO 2003/091376. However, there is a need for new processes and compositions that can be used to remove cured organometal films.

SUMMARY OF INVENTION

The invention provides a process for removing a film from a substrate, said process comprising applying a composition to the film, and
  wherein the composition comprises at least the following:
    a) water; and
    b) at least one compound selected from the following compounds (i-v):
      i) $NR_4HF_2$ (Formula 1),
        wherein R=H, alkyl, substituted alkyl,
      ii) $NR_4F$ (Formula 2),
        wherein R=H, alkyl, substituted alkyl,
      iii) HF (hydrofluoric acid),
      iv) $H_2SiF_6$ (hexafluorosilicic acid), or
      v) combinations thereof.

The invention also provides a composition comprising at least the following:
    a) water; and
    b) at least one compound selected from the following compounds (i-v):
      i) $NR_4HF_2$ (Formula 1),
        wherein R=H, alkyl, substituted alkyl,
      ii) $NR_4F$ (Formula 2),
        wherein R=H, alkyl, substituted alkyl,
      iii) HF (hydrofluoric acid),
      iv) $H_2SiF_6$ (hexafluorosilicic acid), or
      v) combinations thereof.

wherein the composition comprises at least the following:
    a) water; and
    b) at least one compound selected from the following compounds (i-v):
      i) $NR_4HF_2$ (Formula 1),
        wherein R=H, alkyl, substituted alkyl,
      ii) $NR_4F$ (Formula 2),
        wherein R=H, alkyl, substituted alkyl,
      iii) HF (hydrofluoric acid),
      iv) $H_2SiF_6$ (hexafluorosilicic acid), or
      v) combinations thereof.

In one embodiment, the film comprises one or more "metal-oxygen-carbon" bonds.

In one embodiment, the film is an organometal film. In a further embodiment, the organometal film comprises one or more "metal-oxygen-carbon" bonds.

In one embodiment, the substrate comprises a carbon.

In one embodiment, the substrate comprises silicon, and further silicon oxide.

In one embodiment, the substrate comprises an inorganic dielectric material (for example, silicon oxide and/or silicon nitride), an organic antireflective coating (for example, a BARC material), or a carbon underlayer.

In one embodiment, the substrate is selected from an inorganic dielectric material (for example, silicon oxide and/or silicon nitride), an organic antireflective coating (for example, a BARC material), or a carbon underlayer.

In one embodiment, the substrate comprises an inorganic dielectric material (for example, silicon oxide and/or silicon nitride), or an organic antireflective coating (for example, a BARC material).

In one embodiment, the substrate is selected from an inorganic dielectric material (for example, silicon oxide and/or silicon nitride), or an organic antireflective coating (for example, a BARC material).

In one embodiment, the substrate comprises an inorganic dielectric material (for example, silicon oxide and/or silicon nitride).

In one embodiment, the substrate is selected from an inorganic dielectric material (for example, silicon oxide and/or silicon nitride).

In one embodiment, the substrate comprises an organic antireflective coating (for example, a BARC material).

In one embodiment, the substrate is selected from an organic antireflective coating (for example, a BARC material).

In one embodiment, the substrate comprises a carbon underlayer.

In one embodiment, the substrate is selected from a carbon underlayer.

The invention also provides a composition comprising at least the following:
    a) water; and
    b) at least one compound selected from the following compounds (i-v):
      i) $NR_4HF_2$ (Formula 1),
        wherein R=H, alkyl, substituted alkyl,
      ii) $NR_4F$ (Formula 2),
        wherein R=H, alkyl, substituted alkyl,
      iii) HF (hydrofluoric acid),
      iv) $H_2SiF_6$ (hexafluorosilicic acid), or
      v) combinations thereof.

The following embodiments described herein apply to both an inventive process and an inventive composition, each as discussed above.

An inventive process may comprise a combination of two or more embodiments as described herein.

DETAILED DESCRIPTION

As discussed above, the invention provides a process for removing a film from a substrate, said process comprising applying a composition to the film, and An inventive composition may comprise a combination of two or more embodiments as described herein.

In one embodiment, the at least one compound of Component b) is present in an amount greater than, or equal to 0.3 weight percent, based on the weight of the composition.

In one embodiment, the at least one compound of Component b) is present in an amount greater than, or equal to 0.5 weight percent, based on the weight of the composition.

In one embodiment, the at least one compound of Component b) is present in an amount greater than, or equal to 1 weight percent, based on the weight of the composition.

In one embodiment, the at least one compound of Component b) is present in an amount greater than, or equal to 3 weight percent, based on the weight of the composition.

In one embodiment, the at least one compound of Component b) is present in an amount less than, or equal to 30 weight percent, based on the weight of the composition.

In one embodiment, the at least one compound of Component b) is present in an amount less than, or equal to 20 weight percent, based on the weight of the composition.

In one embodiment, the at least one compound of Component b) is present in an amount less than, or equal to 10 weight percent, based on the weight of the composition.

In one embodiment, the at least one compound of Component b) is present in an amount less than, or equal to 5 weight percent, based on the weight of the composition.

In one embodiment, the composition further comprises a polymer that comprises, in polymerized form, an alkylene oxide. In a further embodiment, the alkylene oxide is selected from ethylene oxide, propylene oxide, or a combination thereof.

In one embodiment, the composition has a pH from 3 to 4; for example as determined using pH paper (for example, COLORPHAST, available from EMD Chemicals Inc.).

An inventive process may comprise a combination of two or more embodiments as described herein.

An inventive composition may comprise a combination of two or more embodiments as described herein.

Component b

In one embodiment, the at least one compound of Component b is selected from the following compounds (i-v):
i) $NR_4HF_2$ (Formula 1),
wherein R is H, a C1-C20 alkyl, or a C1-C20 substituted alkyl;
ii) $NR_4F$ (Formula 2),
wherein R is H, a C1-C20 alkyl, or a C1-C20 substituted alkyl;
iii) HF (hydrofluoric acid);
iv) $H_2SiF_6$ (hexafluorosilicic acid); or
v) combinations thereof.

In one embodiment, the at least one compound of Component b is selected from the following compounds (i-v):
i) $NR_4HF_2$ (Formula 1),
wherein R is H, a C1-C10 alkyl, or a C1-C10 substituted alkyl;
ii) $NR_4F$ (Formula 2),
wherein R is H, a C1-C10 alkyl, or a C1-C10 substituted alkyl;
iii) HF (hydrofluoric acid);
iv) $H_2SiF_6$ (hexafluorosilicic acid); or
v) combinations thereof.

In one embodiment, the at least one compound of Component b is selected from the following compounds (i-v):
i) $NR_4HF_2$ (Formula 1),
wherein R is H, a C1-C4 alkyl, or a C1-C4 substituted alkyl;
ii) $NR_4F$ (Formula 2),
wherein R is H, a C1-C4 alkyl, or a C1-C4 substituted alkyl;
iii) HF (hydrofluoric acid);
iv) $H_2SiF_6$ (hexafluorosilicic acid); or
v) combinations thereof.

In one embodiment, the at least one compound of Component b is selected from the following compounds (i, ii or v):
i) $NR_4HF_2$ (Formula 1),
wherein R=H, alkyl, substituted alkyl;
ii) $NR_4F$ (Formula 2),
wherein R=H, alkyl, substituted alkyl; or
v) combinations thereof.

In one embodiment, the at least one compound of Component b is selected from the following compounds (i, ii or v):
i) $NR_4HF_2$ (Formula 1),
wherein R is H, a C1-C20 alkyl, or a C1-C20 substituted alkyl;
ii) $NR_4F$ (Formula 2),
wherein R is H, a C1-C20 alkyl, or a C1-C20 substituted alkyl; or
v) combinations thereof.

In one embodiment, the at least one compound of Component b is selected from the following compounds (i, ii or v):
i) $NR_4HF_2$ (Formula 1),
wherein R is H, a C1-C10 alkyl, or a C1-C10 substituted alkyl;
ii) $NR_4F$ (Formula 2),
wherein R is H, a C1-C10 alkyl, or a C1-C10 substituted alkyl; or
v) combinations thereof.

In one embodiment, the at least one compound of Component b is selected from the following compounds (i, ii or v):
i) $NR_4HF_2$ (Formula 1),
wherein R is H, a C1-C4 alkyl, or a C1-C4 substituted alkyl;
ii) $NR_4F$ (Formula 2),
wherein R is H, a C1-C4 alkyl, or a C1-C4 substituted alkyl;
v) combinations thereof.

In one embodiment, the at least one compound of Component b is selected from the following compounds (i):
i) $NR_4HF_2$ (Formula 1), wherein R=H, alkyl, substituted alkyl.

In one embodiment, the at least one compound of Component b is selected from the following compounds (i):
i) $NR_4HF_2$ (Formula 1), wherein R is H, a C1-C20 alkyl, or a C1-C20 substituted alkyl.

In one embodiment, the at least one compound of Component b is selected from the following compounds (i):
i) $NR_4HF_2$ (Formula 1), wherein R is H, a C1-C10 alkyl, or a C1-C10 substituted alkyl.

In one embodiment, the at least one compound of Component b is selected from the following compounds (i):
i) $NR_4HF_2$ (Formula 1), wherein R is H, a C1-C4 alkyl, or a C1-C4 substituted alkyl.

In one embodiment, the at least one compound of Component b is selected from the following compounds (ii):
ii) $NR_4F$ (Formula 2), wherein R=H, alkyl, substituted alkyl.

In one embodiment, the at least one compound of Component b is selected from the following compounds (ii):
ii) $NR_4F$ (Formula 2), wherein R is H, a C1-C20 alkyl, or a C1-C20 substituted alkyl.

In one embodiment, the at least one compound of Component b is selected from the following compounds (ii):

ii) NR$_4$F (Formula 2), wherein R is H, a C1-C10 alkyl, or a C1-C10 substituted alkyl.

In one embodiment, the at least one compound of Component b is selected from the following compounds (ii):

ii) NR$_4$F (Formula 2), wherein R is H, a C1-C4 alkyl, or a C1-C4 substituted alkyl.

In one embodiment, the at least one compound of Component b is selected from the following compounds (iii, iv, or v):

iii) HF (hydrofluoric acid);

iv) H$_2$SiF$_6$ (hexafluorosilicic acid); or v) combinations thereof.

In one embodiment, the at least one compound of Component b is selected from the following compounds (iii):

iii) HF (hydrofluoric acid).

In one embodiment, the at least one compound of Component b is selected from the following compounds (iv):

iv) H$_2$SiF$_6$ (hexafluorosilicic acid).

The compound of Component b may comprise a combination of two or more embodiments described herein.

Component c

In one embodiment, the composition further comprises Component c) a "water miscible" solvent. Water miscible solvents include, but are not limited to, HBM (methyl-2-hydroxy isobutyrate), PGME (propylene glycol monomethyl ether), EL (ethyl lactate), DPGME (dipropylene glycol methyl ether, mixture of isomers), and combinations thereof.

In one embodiment, the "water miscible" solvent is present in an amount greater than, or equal to 50 weight percent, further greater than, or equal to, 60 weight percent, further greater than, or equal to, 70 weight percent, further greater than, or equal to, 80 weight percent, based on the weight of the composition.

The "water miscible" solvent of Component c may comprise a combination of two or more embodiments described herein.

Composition A

In one embodiment, the film is formed from a "composition A" comprising at least one organometal compound.

In one embodiment, the at least one organometal compound comprises at least one metal selected from Ti, Zr, Hf, Co, Mn, Zn, or combinations thereof.

In one embodiment, the at least one organometal compound comprises at least one metal selected from Ti, Zr, Hf, Co, Mn, or Zn.

In one embodiment, the organometal compound is chelated with at least two oxygen atoms.

In one embodiment, the at least one organometal compound comprises at least one metal selected from Ti, Zr, Hf, or combinations thereof.

In one embodiment, the at least one organometal compound comprises at least one metal selected from Ti, Zr, or Hf.

In one embodiment, organometal compound comprises a metal selected from Ti, Zr, or combinations thereof.

In one embodiment, the organometal compound comprises a metal selected from Ti or Zr.

In one embodiment, the organometal compound is selected from the following compounds:

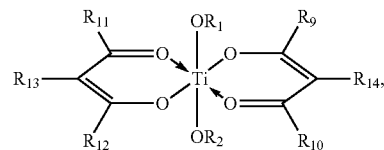

(T1)

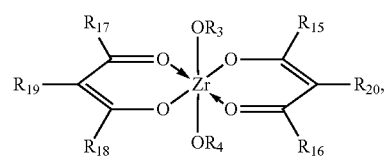

(Z1)

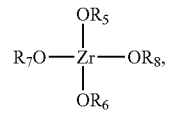

(Z2)

or combinations thereof, and wherein R1, R2, R3, R4, R5, R6, R7 and R8 are each independently selected from the following:
i) hydrocarbon group,
ii) a substituted hydrocarbon group,
iii) a hydrocarbon group containing at least one heteroatom in its backbone, or
iv) a substituted hydrocarbon group containing at least one heteroatom in its backbone; and wherein R9, R10, R11, R12, R13, R14, R15, R16, R17, R18, R19 and R20 are each independently selected from the following:
i) a hydrogen atom,
ii) a hydrocarbon group,
iii) a substituted hydrocarbon group,
iv) a hydrocarbon group containing at least one heteroatom in its backbone, or
v) a substituted hydrocarbon group containing at least one heteroatom in its backbone.

As used herein, R1=R$_1$, R2=R$_2$, R3=R$_3$, and so forth.

In one embodiment, the organometal compound is selected from the following compounds:

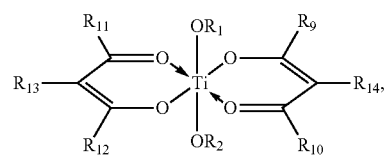

(T1)

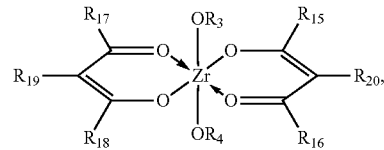

(Z1) or

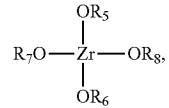

(Z2)

and
wherein R1, R2, R3, R4, R5, R6, R7 and R8 are each defined above, and
wherein R9, R10, R11, R12, R13, R14, R15, R16, R17, R18, R19 and R20 are each defined above.

In one embodiment, the organometal compound is selected from the following compounds:

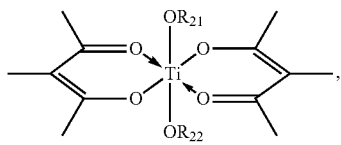 (T2)

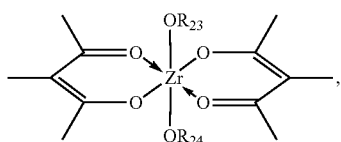 (Z3)

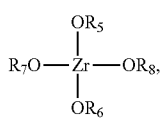 (Z2)

or combinations thereof; and
wherein R5, R6, R7, R8, R21, R22, R23 and R24 are each independently selected from the following:
  i) a hydrocarbon group,
  ii) a substituted hydrocarbon group,
  iii) a hydrocarbon group containing at least one heteroatom in its backbone, or
  iv) a substituted hydrocarbon group containing at least one heteroatom in its backbone. In a further embodiment, R5, R6, R7, R8, R21, R22, R23 and R24 are each independently selected from the following: i) a hydrocarbon group, or ii) a substituted hydrocarbon group. In a further embodiment, R5, R6, R7, R8, R21, R22, R23 and R24 are each independently selected from the following: i) a hydrocarbon group.

In one embodiment, the organometal compound is selected from the following compounds:

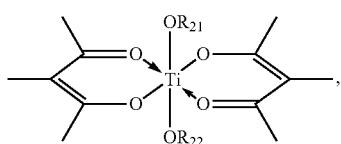 (T2)

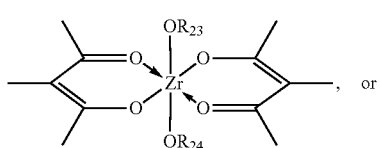 (Z3)

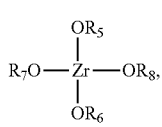 (Z2)

wherein R5, R6, R7, R8, R21, R22, R23 and R24 are each independently selected from the following:
  i) a hydrocarbon group,
  ii) a substituted hydrocarbon group,
  iii) a hydrocarbon group containing at least one heteroatom in its backbone, or
  iv) a substituted hydrocarbon group containing at least one heteroatom in its backbone. In a further embodiment, R5, R6, R7, R8, R21, R22, R23 and R24 are each independently selected from the following: i) a hydrocarbon group, or ii) a substituted hydrocarbon group. In a further embodiment, R5, R6, R7, R8, R21, R22, R23 and R24 are each independently selected from the following: i) a hydrocarbon group.

In one embodiment, the organometal compound is selected from the following compounds:

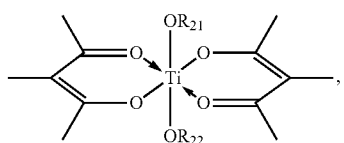 (T2)

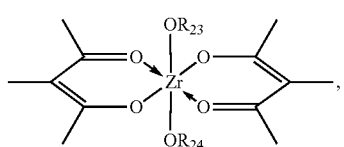 (Z3)

or combinations thereof;
wherein R21, R22, R23 and R24 are each independently selected from the following:
  i) a hydrocarbon group,
  ii) a substituted hydrocarbon group,
  iii) a hydrocarbon group containing at least one heteroatom in its backbone, or
  iv) a substituted hydrocarbon group containing at least one heteroatom in its backbone. In a further embodiment, R21, R22, R23 and R24 are each independently selected from the following: i) a hydrocarbon group, or ii) a substituted hydrocarbon group. In a further embodiment, R21, R22, R23 and R24 are each independently selected from the following: i) a hydrocarbon group.

In one embodiment, the organometal compound is selected from the following compounds:

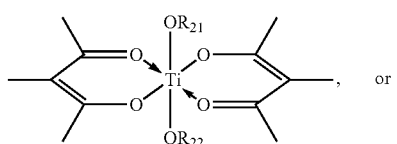 (T2), or

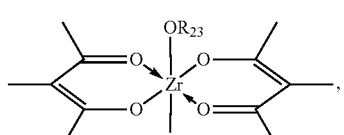 (T3)

wherein R21, R22, R23 and R24 are each independently selected from the following:
  i) a hydrocarbon group,
  ii) a substituted hydrocarbon group,
  iii) a hydrocarbon group containing at least one heteroatom in its backbone, or iv) a substituted hydrocarbon group containing at least one heteroatom in its backbone. In a further embodiment, R21, R22, R23 and R24 are each independently selected from the following: i) a hydrocarbon group, or ii) a substituted hydrocarbon group. In a further embodiment, R21, R22, R23 and R24 are each independently selected from the following: i) a hydrocarbon group.

In one embodiment, the organometal compound is selected from the following compounds:

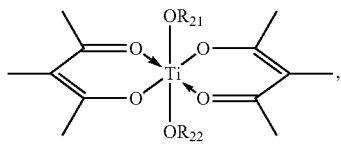
(T2)

wherein R21 and R22 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R21 and R22 are each independently selected from the following: i) a hydrocarbon group, or ii) a substituted hydrocarbon group. In a further embodiment, R21 and R22 are each independently selected from the following: i) a hydrocarbon group.

In one embodiment, the organometal compound is selected from the following compounds:

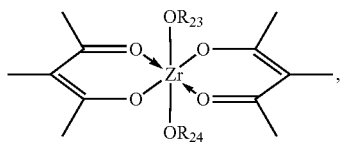
(Z3)

wherein R23 and R24 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R23 and R24 are each independently selected from the following: i) a hydrocarbon group, or ii) a substituted hydrocarbon group. In a further embodiment, R23 and R24 are each independently selected from the following: i) a hydrocarbon group.

In one embodiment, the organometal compound is selected from the following compounds:

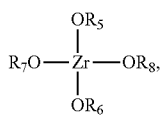
(Z2)

wherein R5, R6, R7 and R8 are each independently selected from the following:
i) a hydrocarbon group,
ii) a substituted hydrocarbon group,
iii) a hydrocarbon group containing at least one heteroatom in its backbone, or
iv) a substituted hydrocarbon group containing at least one heteroatom in its backbone. In a further embodiment, R5, R6, R7 and R8 are each independently selected from the following: i) a hydrocarbon group, or ii) a substituted hydrocarbon group. In a further embodiment, R5, R6, R7 and R8 are each independently selected from the following: i) a hydrocarbon group.

The organometal compound may comprise a combination of two or more embodiments described herein.

In one embodiment, the "composition A" further comprises a polymer comprising, in polymerized from, at least one "monomer that comprises at least one hydroxyl group."

In one embodiment, the polymer comprises less than 1 weight percent silicon, based on the weight of the polymer.

In one embodiment, the polymer comprises less than 0.5 weight percent silicon, based on the weight of the polymer.

In one embodiment, the polymer comprises less than 0.1 weight percent silicon, based on the weight of the polymer.

In one embodiment, the polymer comprises a "monomer that comprises at least one hydroxyl group" based on the weight of the polymer. In a further embodiment, the polymer comprises from 5 to 100 weight percent of the "monomer that comprises at least one hydroxyl group" based on the weight of the polymer.

In one embodiment, the "monomer that comprises at least one hydroxyl group" is selected from HEMA, OH-styrene, or combinations thereof.

In one embodiment, the "monomer that comprises at least one hydroxyl group" is selected from a hydroxy acrylate monomer or a hydroxy alkyl acrylate monomer.

In one embodiment, the "monomer that comprises at least one hydroxyl group" is selected from OH-acrylate, OH-methacrylate, or OH-ethacrylate.

In one embodiment, the polymer further comprises an acrylate monomer or an alkyl acrylate monomer.

In one embodiment, the polymer further comprises an acrylate, a methacrylate, or an ethacrylate.

In one embodiment, the polymer has a molecular weight distribution (Mw/Mn) less than, or equal to, 4.0, or less than, or equal to, 3.5, or less than, or equal to, 3.0, or less than, or equal to, 2.5.

In one embodiment, the polymer has a molecular weight distribution (Mw/Mn) greater than, or equal to, 1.1, or greater than, or equal to, 1.5, or greater than, or equal to, 1.7.

In one embodiment, the polymer has a number average molecular weight (Mn) less than, or equal to, 15000 g/mole, or less than, or equal to, 12000 g/mole, or less than, or equal to, 10000 g/mole.

In one embodiment, the polymer has a number average molecular weight (Mn) greater than, or equal to, 4000 g/mole, or greater than, or equal to, 5000 g/mole, or greater than, or equal to, 6000 g/mole.

In one embodiment, the polymer has a weight average molecular weight (Mw) less than, or equal to, 35000 g/mole, or less than, or equal to, 30000 g/mole, or less than, or equal to, 25000 g/mole.

In one embodiment, the polymer has a weight average molecular weight (Mw) greater than, or equal to, 7000 g/mole, or greater than, or equal to, 7500 g/mole, or greater than, or equal to, 8000 g/mole.

In one embodiment, the organometal compound is present in an amount greater than 10 weight percent, based on the weight of the polymer and the organometal compound.

In one embodiment, the organometal compound is present in an amount greater than 20 weight percent, based on the weight of the polymer and the organometal compound.

In one embodiment, the organometal compound is present in an amount greater than 50 weight percent, based on the weight of the polymer and the organometal compound.

In one embodiment, the organometal compound is present in an amount greater than 75 weight percent, based on the weight of the polymer and the organometal compound.

The polymer may comprise a combination of two or more embodiments described herein.

The organometal compound may comprise a combination of two or more embodiments described herein.

Composition A may comprise a combination of two or more embodiments described herein.

DEFINITIONS

The term "composition," as used herein, includes the material(s) which comprise the composition, as well as reaction products and decomposition products formed from the material(s) of the composition.

The term "polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined hereinafter. Trace amounts of impurities, such as catalyst residues, can be incorporated within the polymer.

The term "interpolymer," as used herein, refers to polymers prepared by the polymerization of at least two different types of monomers. The generic term interpolymer includes copolymers (employed to refer to polymers prepared from two different monomers), and polymers prepared from more than two different types of monomers.

The term "hydrocarbon," as used herein, refers to a chemical compound or substituent containing only carbon and hydrogen atoms.

The term "substituted hydrocarbon," as used herein, refers to a hydrocarbon with one or more of the hydrogens substituted with another group comprising at least one heteroatom, such as, for example, a halogen (such as chlorine or bromine), or other group of atoms, such as —OH, —C—O—C—, —CN, —SH, —SO$_3$H.

The term "substituted alkyl," as used herein, refers to an alkyl with one or more of the hydrogens substituted with another group comprising at least one heteroatom, such as, for example, a halogen (such as chlorine or bromine), or other group of atoms, such as —OH, —C—O—C—, —CN, —SH, —SO$_3$H.

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step, or procedure, excepting those that are not essential to operability. The term "consisting of" excludes any component, step, or procedure not specifically delineated or listed.

Test Methods

Measurement of Molecular Weight by GPC

Molecular weight of the prepolymer was monitored by Gel Permeation Chromatography (GPC), also referred to as Size Exclusion Chromatography (SEC). The instrument was equipped with a set of columns appropriate for measuring molecular weights in the range from about 500 g/mole to at least about 100,000 g/mole, based on polystyrene calibration standards. Four columns installed series, "SHODEX LF-805, 804, 803 and 802 GPC columns," 8 mm diameter×300 mm length, available from Thomson Instrument Co., were used in each analysis. All four columns were maintained at 30° C. The mobile phase was tetrahydrofuran (THF), and it was pumped at a rate of 1 mL/min Injection volume was 100 microliter. The instrument was also equipped with a refractive index detector. Calibration was done using polystyrene standards with narrow MWDs, available from Polymer Standards Service GmbH, Mainz, Germany. The Mn, Mw, and MWD (Mw/Mn) were calculated using ENPOWER GPC software available from WATERS.

EXPERIMENTAL

I. Reagents
A. Binder Polymers (Component A)
  HEMA=2-Hydroxyethyl methacrylate,
  MMA=Methyl methacrylate,
B. Organometal Compounds
  1) TYZOR AA-105 available from DORF KETAL.

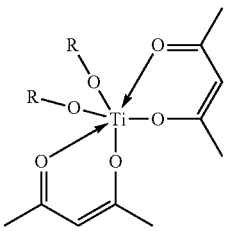

C. Solvents
  1) Propylene glycol methylether acetate (PGMEA, bp 146° C.)
D. Thermal Acid Generator (TAG)
  Triethylammonium 4-methylbenzenesulfonate (TEA pTS)—see below.

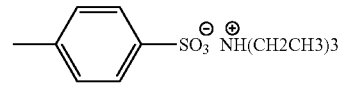

II. Syntheses of Binder Polymer
A) 30/70(w) HEMA/MMA
  Preparation of a "60 g (polymer) batch" of "30/70(w) HEMA/MMA."
Monomer/Initiator Feeding Solution
  To a suitable container (a glass bottle), the following materials were added: 18.0 g HEMA, 42.0 g MMA and 30.0 g PGMEA (propylene glycol methylether acetate) solvent. The container was capped, and gently shaken to mix all components. The container was then placed in an ice bath, to equilibrate the temperature of the container with the bath temperature. An initiator (1.8 g of V-601 initiator) was then added to the container. The container was removed from the ice bath, and shaken to completely dissolve the initiator, and then placed back into the ice bath. The initiator, V-601, was dimethyl-2,2'-azobis(2-methylpropionate), available from Wako Pure Chemical Industries, Ltd.

Polymerization

The reactor was a 250 ml, 3-neck, round bottom flask, equipped with a condenser and a thermal couple, and connected to a feeding line for the monomer/initiator solution (prepared above). The thermal couple was used, in conjunction with a controlled heating mantle, to monitor and control the solution temperature in the reactor. The contents of the reactor were stirred with a magnetic stir bar.

The reactor was charge with "30.0 g PGMEA," and the reactor temperature was increased and equilibrated at 99° C. (±2° C.) with adequate agitation. The monomer/initiator solution (prepared above) was fed into the reactor at 99° C., at feeding rate of 250 μl/13 sec, using a HAMILTON dual syringe pump. The total feeding time was approximately 90 minutes. After completion of this feed, the reactor temperature was held at 99° C. for an additional two hours, and then the reaction flask was remove from the heating mantle, and allowed to cool naturally to room temperature. Approximately "90 g of PGMEA" was added to the reactor polymer to obtain a uniform solution after stirring. The polymer solution in the reactor was used "as is," without further purification. The percent solid content of the polymer in the solution was determined using a "weight loss method." In this method, approximately "0.1 g of the polymer solution" was weighted into an aluminum pan, and approximately "0.6 g acetone" was added, to dilute the solution, and to promote an even coating at the bottom of the pan. The pan (plus contents) was placed in a thermal oven, equilibrated at approximately 110° C., and the pan (plus contents) was thermally treated for 15 minutes. The final polymer solution contained approximately 28 wt % polymer, based on the weight of the polymer solution.

Molecular weight and molecular weight distribution were determined using the aforementioned GPC method, and are summarized in Table 1 below.

TABLE 1

Molecular Weights and Molecular Weight Distributions

| Binder Polymers | Mw | Mn | MWD |
|---|---|---|---|
| 30/70 (w) HEMA/MMA | 16526 | 8335 | 1.98 |

III. Spin-On Mixed Metal Hardmask (SOMMH) Films

High temperature cured SOMMH films were spin-coated from the following formulation.

30/70 HEMA/MMA random copolymer—1.5 wt % copolymer in final formulation.

TYZOR AA-105 (DORF KETAL)—4.5 wt % in final formulation.

PGMEA solvent—94 wt % in final formulation.

Substrate: silicon wafer from WaferNet Inc., diameter of 8 inch; thickness of 0.7-0.8 mm No pre-treatment The formulation was filtered through a "0.2 μm pore size" TFPE syringe filter, before spin coating.

The spin coating was performed using TEL, ACT 2 Track with manual dispensing (using 1.5 to 2.5 ml of a formulation for each coating).

The formulation was prepared from the following polymer solutions.

30/70 HEMA/MMA polymer solution: 10.0 wt % polymer in PGMEA.

TYZOR AA-105 organometal solution: 10.0 wt % organometal in PGMEA.

The hardmask formulations were prepared under ambient conditions. Each formulation was prepared by mixing the corresponding stock solutions and solvent, in a suitable container (glass vial), in the following addition order: 1) polymer solution, 2) solvent, 3) organometal solution. Each film was spin coated at 1500 rpm, followed by pre-bake at 105° C. for 60 seconds, and curing bake at 350° C. for 90 seconds. Uniform films of approximately 200 Å thickness were formed.

IV. Removal of Films

Study I ($NH_4HF_2$/H2O/optional Surfactant)

In this study, $NH_4HF_2$, in deionized (DI) water, was selected as an active component to breakdown the Ti—O—C linkages and the $TiO_2$ domains, under a slight acidic condition. Deionized (DI) water was the solvent, used with, or without, a surfactant.

1) Ammonium bifluoride (NH4HF2)
2) Surfactant: a random copolymer of ethylene oxide and propylene oxide (Mw of about 600 to 5000 g/mole).

Compositions are shown in Table 2. Each composition (approx. 5 ml) was added, dropwise, onto a SOMMH film, prepared as discussed above. The pH value of Composition 7 was about 3 to 4, measured with a pH paper (COLORPHAST, available from EMD Chemicals Inc.). The film removal was visually observed, and the results are reported in Table 2 below.

TABLE 2

Compositions and Results

| Composition | $NH_4HF_2$ (wt %)* | Surfactant (wt %)* | Remove 200 Å organo titanate film in 60 seconds |
|---|---|---|---|
| 1 | 30.0 | 0 | yes |
| 2 | 10.0 | 0 | yes |
| 3 | 5.00 | 0 | yes |
| 4 | 2.50 | 0 | yes |
| 5 | 1.25 | 0 | yes |
| 6 | 0.625 | 0 | yes |
| 7 | 0.600 | 1.0 | yes |
| 8 | 0.313 | 0 | yes |
| 9 | 0.156 | 0 | no |

*wt % based on weight of composition

Study II ($NH_4HF_2$/H2O/HBM)

In this study, an ammonium bifluoride ($NH_4HF_2$) stock solution (30% by weight in DI water) was used. Methyl-2-hydroxy isobutyrate (HBM) was also used.

Compositions are shown in Table 3. Each composition (approx. 5 ml) was added, dropwise, onto a SOMMH film, prepared as discussed above. The film removal was visually observed, and the results are reported in Table 3 below. Each composition was able to remove the organotitanate film in a few seconds to less than 60 seconds.

TABLE 3

Compositions and Results

| weight ratio | | | Content in formulation, wt %* | | |
|---|---|---|---|---|---|
| $NH_4HF_2$ Stock | HBM | H2O | NH4HF2 | HBM | H2O |
| 5 | 5 | 0 | 15.00 | 50.00 | 35.00 |
| 4 | 5 | 1 | 12.00 | 50.00 | 38.00 |

TABLE 3-continued

Compositions and Results

| weight ratio | | | Content in formulation, wt %* | | |
|---|---|---|---|---|---|
| NH$_4$HF$_2$ Stock | HBM | H2O | NH4HF2 | HBM | H2O |
| 35 | 65 | 10 | 9.55 | 59.09 | 31.36 |
| 30 | 70 | 10 | 8.18 | 63.64 | 28.18 |
| 25 | 75 | 10 | 6.82 | 68.18 | 25.00 |
| 20 | 82 | 10 | 5.36 | 73.21 | 21.43 |
| 10 | 100 | 12 | 2.46 | 81.97 | 15.57 |
| 13 | 133 | 21 | 2.34 | 79.64 | 18.02 |
| 11.7 | 150 | 22.9 | 1.90 | 81.26 | 16.84 |
| 11.7 | 203 | 38.8 | 1.38 | 80.08 | 18.54 |
| 13.3 | 695 | 74.7 | 0.51 | 88.76 | 10.73 |
| 12.8 | 1018 | 107 | 0.34 | 89.47 | 10.19 |
| 12.4 | 1301 | 158 | 0.25 | 88.42 | 11.33 |
| 11.6 | 1513 | 245 | 0.20 | 85.50 | 14.30 |
| 11.3 | 2039 | 293 | 0.14 | 87.01 | 12.84 |
| 13.2 | 2500 | 312 | 0.14 | 88.49 | 11.37 |
| 13.1 | 3001 | 383 | 0.12 | 88.34 | 11.54 |
| 13.1 | 4004 | 512 | 0.09 | 88.41 | 11.51 |

*wt % based on weight of composition

Study III (NH$_4$HF$_2$/H2O/EL)

In this study, an ammonium bifluoride (NH$_4$HF$_2$) stock solution (30% by weight in DI water) was used. Ethyl Lactate (EL) was also used.

Compositions are shown in Table 4. Each composition (approx. 5 ml) was added, dropwise, onto a SOMMH film, prepared as discussed above. The film removal was visually observed, and the results are reported in Table 4 below. Each composition was able to remove the organotitanate film in a few seconds to less than 60 seconds.

TABLE 4

Compositions and Results

| weight ratio | | | Content in Formulation, wt %* | | |
|---|---|---|---|---|---|
| NH$_4$HF$_2$ Stock | EL | H2O | NH4HF2 | EL | H2O |
| 10.8 | 100 | 21 | 2.46 | 75.87 | 21.67 |
| 12.1 | 504 | 146 | 0.55 | 76.12 | 23.33 |
| 10.9 | 1001 | 295 | 0.25 | 76.59 | 23.16 |
| 13.6 | 2003 | 579 | 0.16 | 77.17 | 22.67 |
| 15.4 | 3994 | 1157 | 0.09 | 77.31 | 22.60 |

*wt % based on weight of composition.

Study IV (NH$_4$HF$_2$/H2O/DPGME)

In this study, an ammonium bifluoride (NH$_4$HF$_2$) stock solution (30% by weight in DI water) was used. Dipropylene Glycol Monomethyl Ether (DPGME) was also used.

Compositions are shown in Table 5. Each composition (approx. 5 ml) was added, dropwise, onto a SOMMH film, prepared as discussed above. The film removal was visually observed, and the results are reported in Table 5 below. Each composition was able to remove the organotitanate film in a few seconds to less than 60 seconds.

TABLE 5

Compositions and Results

| weight ratio | | | Content in formulation, wt %* | | |
|---|---|---|---|---|---|
| NH$_4$HF$_2$ Stock | DPGME | H2O | NH4HP2 | DPGME | H2O |
| 10.8 | 100 | 40 | 2.15 | 66.31 | 31.54 |
| 10.1 | 511 | 205 | 0.42 | 70.38 | 29.21 |
| 12.9 | 1022 | 403 | 0.27 | 71.08 | 28.65 |

TABLE 5-continued

Compositions and Results

| weight ratio | | | Content in formulation, wt %* | | |
|---|---|---|---|---|---|
| NH$_4$HF$_2$ Stock | DPGME | H2O | NH4HP2 | DPGME | H2O |
| 12.3 | 2000 | 799 | 0.13 | 71.14 | 28.73 |
| 12.6 | 4050 | 1486 | 0.07 | 72.99 | 26.94 |

*wt % based on weight of composition

Study V (NH$_4$HF$_2$/H2O/PGME)

In this study, an ammonium bifluoride (NH$_4$HF$_2$) stock solution (30% by weight in DI water) was used. Propylene Glycol Monomethyl Ether (PGME) was also used.

Compositions are shown in Table 6. Each composition (approx. 5 ml) was added, dropwise, onto a SOMMH film, prepared as discussed above. The pH value of each of these compositions was about 4, as measured with the pH paper. The film removal was visually observed, and the results are reported in Table 6 below. Each composition was able to remove the organotitanate film in a few seconds to less than 60 seconds.

TABLE 6

Compositions and Results

| weight ratio | | | Content in formulation, wt %* | | |
|---|---|---|---|---|---|
| NH$_4$HF$_2$ Stock | PGME | H2O | NH4HF2 | PGME | H2O |
| 10.4 | 104 | 22 | 2.29 | 76.25 | 21.47 |
| 10.9 | 500 | 100 | 0.54 | 81.85 | 17.62 |
| 11.4 | 1001 | 211 | 0.28 | 81.82 | 17.90 |
| 13.4 | 2004 | 408 | 0.17 | 82.63 | 17.21 |
| 13.1 | 4002 | 847 | 0.08 | 82.31 | 17.61 |

*wt % based on weight of composition

As shown above, the compositions in Tables 2-6 effectively removed the organometal film in 60 seconds or less. These compositions are suitable for the removal or organometal films formed from a spin coating process or other processes.

The invention claimed is:

1. A process for removing a film from a substrate, said process comprising applying a composition to the film, and wherein the composition comprises at least the following:
   a) water; and
   b) at least one compound selected from the following compounds (i-v):
      i) NR$_4$HF$_2$ (Formula 1), wherein R=H, alkyl, substituted alkyl,
      ii) NR$_4$F (Formula 2), wherein R=H, alkyl, substituted alkyl,
      iii) HF (hydrofluoric acid),
      iv) H$_2$SiF$_6$ (hexafluorosilicic acid), or
      v) combinations thereof; and
   wherein the film is formed from a "composition A" comprising at least one organometal compound, and wherein the at least one organometal compound comprises at least one metal selected from Ti, Zr, Hf, Co, Mn or Zn.

2. The process of claim 1, wherein the film is an organometal film.

3. The process of claim 1, wherein the film comprises one or more "metal-oxygen-carbon" bonds.

4. The process of claim 1, wherein the at least one organometal compound is selected from the following compounds:

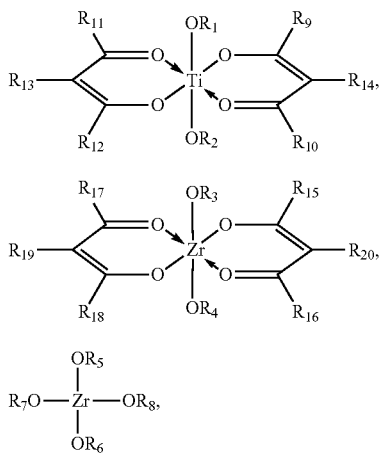

or combinations thereof, and
wherein R1, R2, R3, R4, R5, R6, R7 and R8 are each independently selected from the following:
i) hydrocarbon group,
ii) a substituted hydrocarbon group,
iii) a hydrocarbon group containing at least one heteroatom in its backbone, or
iv) a substituted hydrocarbon group containing at least one heteroatom in its backbone; and
wherein R9, R10, R11, R12, R13, R14, R15, R16, R17, R18, R19 and R20 are each independently selected from the following:

i) a hydrogen atom,
ii) a hydrocarbon group,
iii) a substituted hydrocarbon group,
iv) a hydrocarbon group containing at least one heteroatom in its backbone, or
v) a substituted hydrocarbon group containing at least one heteroatom in its backbone.

5. The process of claim 1, wherein "composition A" further comprises a polymer comprising, in polymerized form, at least one "monomer that comprises at least one hydroxyl group.

6. The process of claim 5, wherein the polymer comprises less than 1 weight percent silicon, based on the weight of the polymer.

7. The process of claim 1, wherein the at least one compound of Component b) is present in an amount greater than, or equal to, 0.3 weight percent, based on the weight of the composition.

8. The process of claim 1, wherein the composition further comprises Component c) a "water miscible" solvent.

9. The process of claim 1, wherein the composition further comprises a polymer that comprises, in polymerized form, an alkylene oxide.

10. The process of claim 9, wherein the alkylene oxide is selected from ethylene oxide, propylene oxide, or a combination thereof.

11. The process of claim 1, wherein the composition has a pH from 3 to 4.

\* \* \* \* \*